(12) United States Patent
Silverman

(10) Patent No.: US 7,326,502 B2
(45) Date of Patent: Feb. 5, 2008

(54) MULTILAYER COATINGS FOR EUV MASK SUBSTRATES

(75) Inventor: Peter J. Silverman, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 771 days.

(21) Appl. No.: 10/665,416

(22) Filed: Sep. 18, 2003

(65) Prior Publication Data

US 2005/0064298 A1 Mar. 24, 2005

(51) Int. Cl.
*G03F 1/00* (2006.01)

(52) U.S. Cl. .......................................................... 430/5
(58) Field of Classification Search ................... 430/5; 428/428, 430; 378/35
See application file for complete search history.

(56) References Cited

U.S. PATENT DOCUMENTS

| | | | | |
|---|---|---|---|---|
| 6,489,066 | B2 * | 12/2002 | Mirkanimi | 430/5 |
| 6,756,163 | B2 * | 6/2004 | Yan | 430/5 |
| 6,905,801 | B2 * | 6/2005 | Liang et al. | 430/5 |
| 6,908,714 | B2 * | 6/2005 | Yan et al. | 430/5 |

OTHER PUBLICATIONS

Claude Montcalm, "In situ Characterization of EUV Multiplayer Mirrors Deposited by UHV Magnetron Sputterin", Information Science and Technology, Lawrence Livermore National Laboratory, University of California, Livermore, CA.

Rick Tejeda, "EUV Mask Modeling", Computational Mechanics Center, Mechanical Engineering Department, University of Wisconsin-Madison, Mar. 4, 1999.

John E. Bjorkholm, "EUV Lithography—The Successor to Optical Lithography?", Intel Technology Journal Q#'98, pp. 1-8.

Matthieu F. Bal et al., "the Influence of Multilayers on the Optical Performance of Extreme Ultra Violet Projection Systems", Optics Research Group, Delft University of Technology.

A. Mikkelson et al., "Mounting Effects on Image Placement Errors", Computational Mechanics Center, Mechanical Engineering Department, University of Wisconsin-Madison.

S. Wolf et al., "Silicon Processing for the VLSI Era", vol. 1; Process Technology, Second Edition, Lattice Press, Sunset Beach, CA, pp. 444-450, 468-483, 777, 649-650, and 666.

* cited by examiner

*Primary Examiner*—S. Rosasco
(74) *Attorney, Agent, or Firm*—Fish & Richardson P.C.

(57) ABSTRACT

Techniques, methods, and structures disclosed in relation to extreme ultraviolet (EUV) lithography in semiconductor processing. In one exemplary implementation, a method may comprise using ion beam deposition to deposit a first multilayer stack of thin films on a substrate to planarize and smooth surface defects on the substrate. The method includes using atomic layer deposition to deposit a second multilayer stack of thin films on the first multilayer stack of thin films. The second multilayer stack of thin films may comprise an extreme ultraviolet reflective multilayer stack. The second multilayer stack of thin films may comprise fewer surface defects than the first multilayer stack of thin films. The method may further comprise processing an extreme ultraviolet mask blank to form an extreme ultraviolet reflective mask.

13 Claims, 4 Drawing Sheets

MULTILAYER COATINGS FOR EUV MASK SUBSTRATES

TECHNICAL FIELD

The current disclosure relates to semiconductor processing, and more particularly to Extreme Ultraviolet (EUV) lithography.

BACKGROUND

The growth of new applications in computer processing, digital and analog signal transmissions, and wireline and wireless equipment has lead to trends of smaller feature sizes and an increasing number of devices on semiconductor wafer. In order to form smaller feature sizes on a semiconductor wafer, shorter wavelengths are oftentimes utilized in lithography. During semiconductor processing, short wavelengths for small feature sizes may be produced using lithography with Extreme Ultraviolet (EUV) radiation. Radiation from the EUV portion of the electromagnetic spectrum may be different from radiation in the visible and UV wavelength ranges in that EUV radiation has shorter wavelengths and EUV radiation may be absorbed in many refractive optical materials. EUV lithography oftentimes uses reflective optical materials instead of refractive optical materials. Such reflective materials may be achieved with multilayer, thin-film coatings that may serve as a Bragg reflector for EUV radiation.

DESCRIPTION OF DRAWINGS

Like reference symbols in the various drawings may indicate like elements.

DETAILED DESCRIPTION

Figure 1:
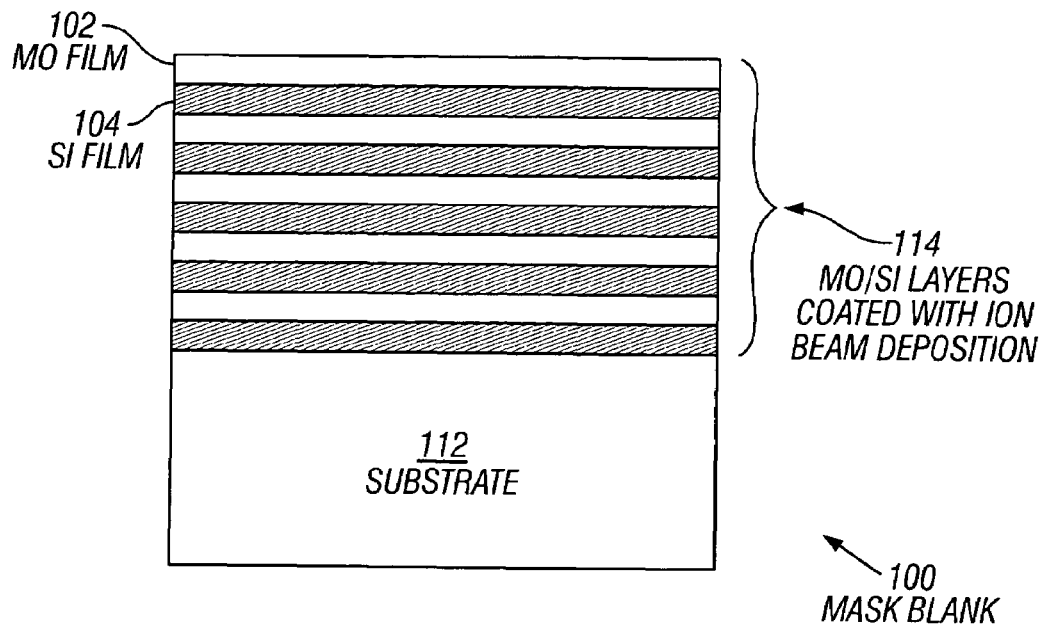
FIG. 1 is a diagram of an exemplary EUV reflective mask blank.

The current disclosure includes techniques, systems, and methods for reducing defects in EUV masks and EUV mask blanks.

When compared to conventional optical lithography, EUV lithography may help to produce smaller feature sizes on a wafer by using shorter wavelengths. For instance EUV wavelengths may range from about 1 nm-40 nm, with EUV lithography wavelengths ranging around 10 nm -14 nm in certain implementations. Since EUV radiation is at a wavelength that is absorbed in many materials, a reflective mask may be used to replace a conventional optical transmission mask used in many conventional optical lithography processes at longer wavelengths. EUV lithography uses a mask structure to reflect patterned EUV radiation onto a semiconductor wafer. The EUV reflective mask may include one or more layers that are reflective to EUV radiation. The reflective layers may be multiple alternating layers with different optical properties for each alternating layer. The alternating layers may be shown as layer pairs or bi-layers in one or more exemplary figures in the present disclosure. Such reflective layers may include alternating thin film layers of Molybdenum and Silicon (Mo/Si) or Molybdenum and Beryllium (Mo/Be). The reflective layers may also include alternating thin film layers of Molybdenum and a Silicon compound, such as Silicon Nitride (SiN) and Silicon Dioxide ($SiO_2$). The alternating layers have dissimilar EUV optical constants and form a periodic structure to provide a resonant reflectivity when the Bragg resonant condition is satisfied. The EUV radiation reflection may be distributed among several alternating layers or multilayers of thin films, much like a Bragg reflector.

In one exemplary implementation, a method comprises using ion beam deposition to deposit a first multilayer stack of thin films on a substrate to planarize and smooth surface defects on the substrate. The method also comprises using atomic layer deposition to deposit a second multilayer stack of thin films on the first multilayer stack of thin films, in which the second multilayer stack of thin films comprises an extreme ultraviolet reflective multilayer stack.

In another exemplary implementation, an apparatus may comprise a substrate, a first multilayer of films on top of the substrate, and a second multilayer of films on top of the first multilayer of films. The first multilayer of films on the substrate may form a flat top surface by a first deposition process. The second multilayer of films may effectuate a Bragg reflector to reflect extreme ultraviolet radiation. The second multilayer of films may be deposited with a second deposition process. The first deposition process may be an ion beam deposition process, and the second deposition process may be an atomic layer deposition process. The multiple layers of films may comprise alternating layers of films, in which the alternating layers of films comprise a first film and a second film with different optical properties. The multiple layers of films may comprise multiple layers of thin films. Other features and advantages of one or more exemplary implementations will be apparent from the description and drawings, and from the claims.

FIG. 1 shows an example of an exemplary mask blank 100. As used herein, a mask blank 100 may refer to a substrate 112 with one or more unpatterned multilayers 114 of thin films, in which at least one of the unpatterned multilayers of thin films may be used for reflecting EUV radiation. A mask may refer to a mask blank 100 with one or more patterned layers on top of the mask blank 100. The substrate 112 may refer to a low thermal expansion material, such as glass. The multilayer stack 114 may include alternating layers of thin films, such as a Molybdenum layer 102 and a Silicon layer 104. In general, the Molybdenum layer 102 may be around 2.8 nm in thickness and the Silicon layer 104 may be around 4.0 nm or 4.1 nm in thickness. The thicknesses of the layers 102, 104 may vary from the thicknesses described above.

As in a Bragg reflector, a number of layers in a multilayer stack can improve reflectivity. Typically, around 40 to 60 alternating layers can provide a sufficient amount of reflection for EUV lithography.

The multilayers 114 may be deposited with ion beam deposition or another type of high precision sputtering system. Ion beam deposition has a beneficial property of smoothing defects of 50 nm or smaller on the substrate 112. Hence, ion beam deposition may smooth and planarize the layers above the substrate 112 used for the EUV mask or mask blank. However, ion beam deposition tends to lead to defects on the surface of the deposited layer. In one example, a beam of Molybdenum ions/atoms may collide and entrap particles in the ion beam deposition chamber and carry those particles to the deposited layer to contribute to surface defects and a non-planarized surface. Such surface defects may detrimentally affect the reflectivity of an EUV mask.

In one regard, the present disclosure presents techniques, systems, and methods to reduce the amount of defects associated with reflective multilayers for EUV masks and mask blanks. In another regard, the present disclosure presents techniques, systems, and methods to improve EUV radiation reflectivity by smoothing and planarizing reflective multilayers above a mask substrate with defects.

Figure 2:
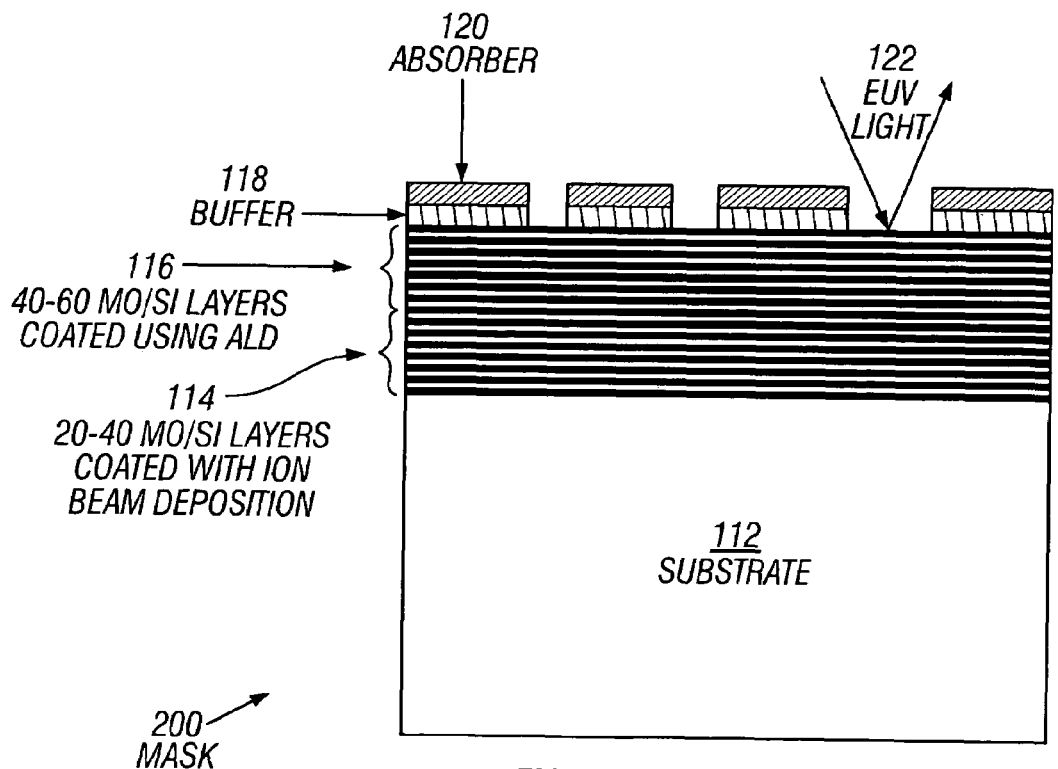
FIG. 2 is a diagram of an exemplary EUV reflective mask.

FIG. 2 shows an exemplary implementation of an EUV mask 200. In the EUV mask 200, a first multilayer stack 114 of Molybdenum and Silicon thin films may be deposited on a substrate 112 with ion beam deposition. A second multilayer stack 116 of Molybdenum and Silicon thin films may be deposited with atomic layer deposition (ALD) on top of the first multilayer stack 114. A buffer layer 118 or an oxide layer, such as SiN or $SiO_2$, may be patterned on the second multilayer stack 116. A layer 120 that absorbs EUV radiation, such as a layer made of an absorber metal, may be patterned on the buffer layer 118 according to an integrated circuit (IC) design. The patterned absorber layer 120 selectively absorbs the EUV radiation 122 to produce an intensity pattern on the reflected EUV beam. The first multilayer stack 114 may be used to smooth substrate defects and the second multilayer stack 116 may provide a smooth and flat reflective surface for EUV radiation 122.

Atomic layer deposition may be an alternative method for the deposition of thin films. In atomic layer deposition the amount of defects in deposited layers may be much lower than layers deposited with ion beam deposition. Atomic layer deposition may generate fewer defects since the deposition is performed in an ultra-high vacuum environment that does not contain as many unwanted particles as in ion beam deposition. Unlike ion beam deposition, atomic layer deposition may tend to conformally coat a surface and may not tend to smooth or planarize substrate defects.

In FIG. 2, the mask 200 may use ion beam deposition of the multilayer stack 114 to smooth substrate defects. In general, around 20-40 alternating layers of Molybdenum and Silicon thin films 114 may be used for smoothing and planarization. The number of alternating layers, layer pairs, or bi-layers of thin films may have other numbers of alternating layers other than around 20-40 alternating layers. Since the multilayer stack 114 does not need to be used for reflectivity, the number of alternating layers may depend, in part, on the number of layers needed for smoothing the substrate defects.

The multilayer stack 116 coated with atomic layer deposition may be used for EUV radiation reflectivity and may provide one or more lithography advantages due to low defect levels in atomic layer deposition coatings. In general, around 40-60 alternating layers of Molybdenum and Silicon thin films 116 may be used for EUV radiation reflectivity. The number of alternating layers, layer pairs, or bi-layers, however, may vary from 40-60 alternating layers, but should provide EUV radiation reflectivity.

Figure 3:
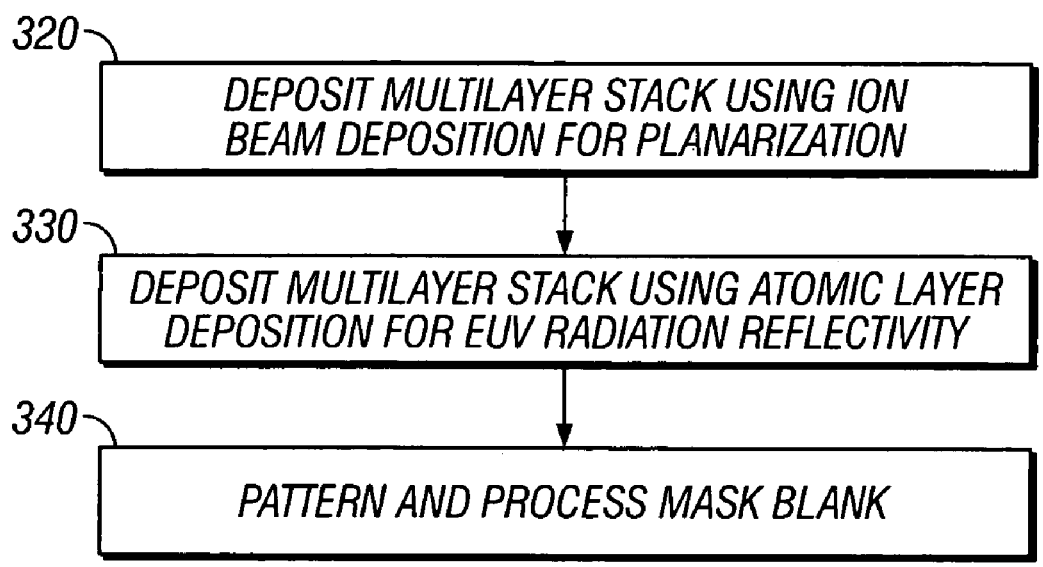
FIG. 3 is a processing flow diagram for an exemplary EUV mask blank.

FIG. 3 presents a processing flow diagram for an exemplary EUV mask blank. A first multilayer stack 114 may be deposited 320 on a substrate using ion beam deposition. The first multilayer stack 114 can planarize and smooth surface defects on the substrate. A second multilayer stack 116 may be deposited 330 on the first multilayer stack using atomic layer deposition. The second multilayer stack 116 may provide EUV radiation reflectivity. The EUV mask blank may then be further processed and patterned 340 to form an EUV mask.

Figure 4:
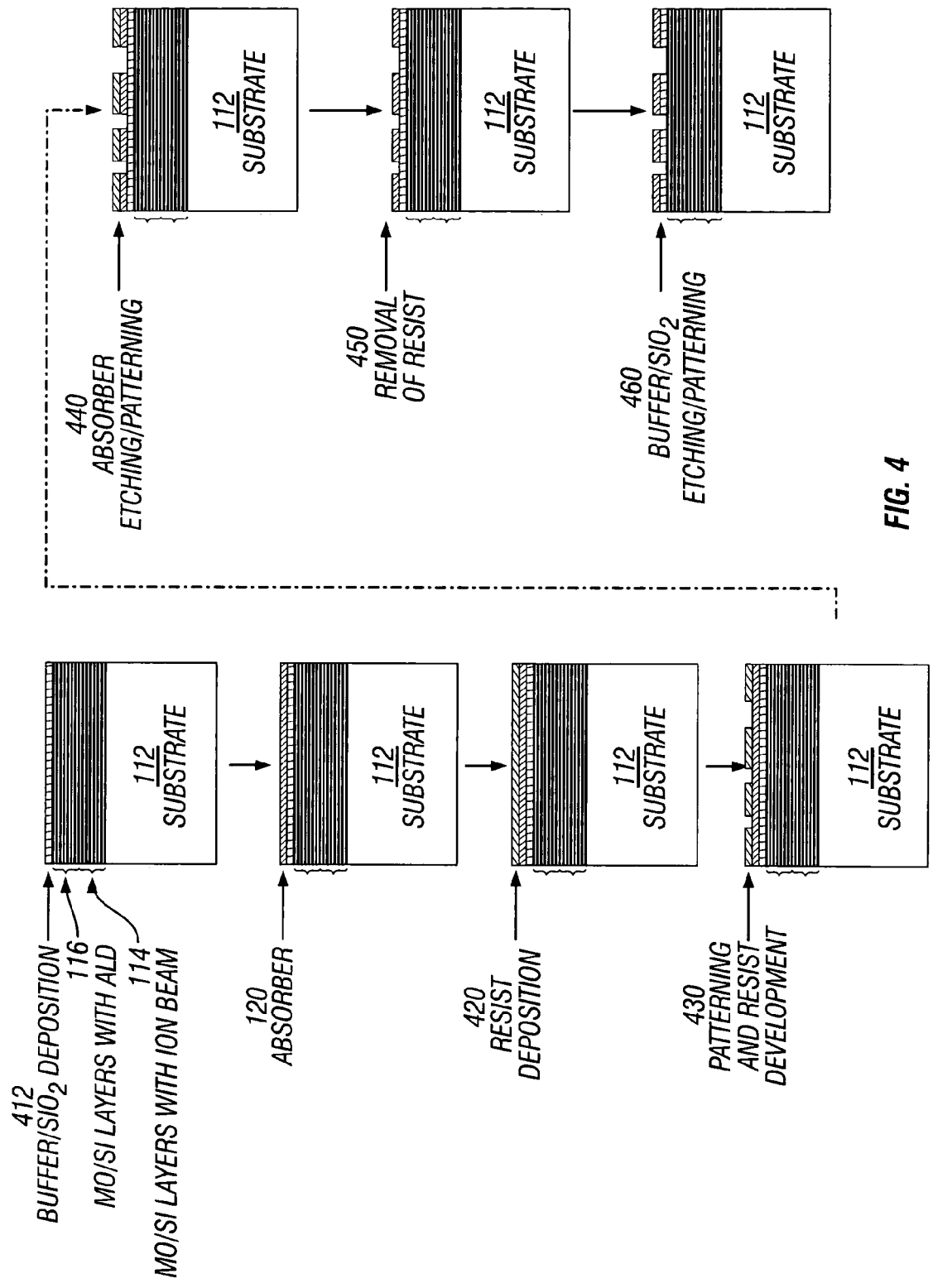
FIG. 4 is an illustrative processing diagram for an exemplary EUV reflective mask.

FIG. 4 presents an illustrative processing diagram for an exemplary EUV reflective mask. The processed EUV mask blank described in FIG. 3 may be further processed as shown in FIG. 4 to form an EUV mask. The processed EUV mask of FIG. 4 may resemble the EUV mask 200 of FIG. 2.

In FIG. 4, the mask blank may have a buffer layer deposited 412 on the second multilayer stack 116. The buffer layer 118 may be an oxide, such as $SiO_2$. An absorber layer 120, such as a layer of EUV absorber metal, may be deposited on the buffer layer 118. A layer of resist may be deposited on the absorber layer 120. The layer of resist may then be patterned and developed 430. After resist patterning, the absorber layer 120 may then be patterned and/or etched 440. The resist layer may be removed 450 and the buffer layer 118 may then be patterned and/or etched 460 to expose the reflective surface of the second multilayer stack 116.

Figure 5:
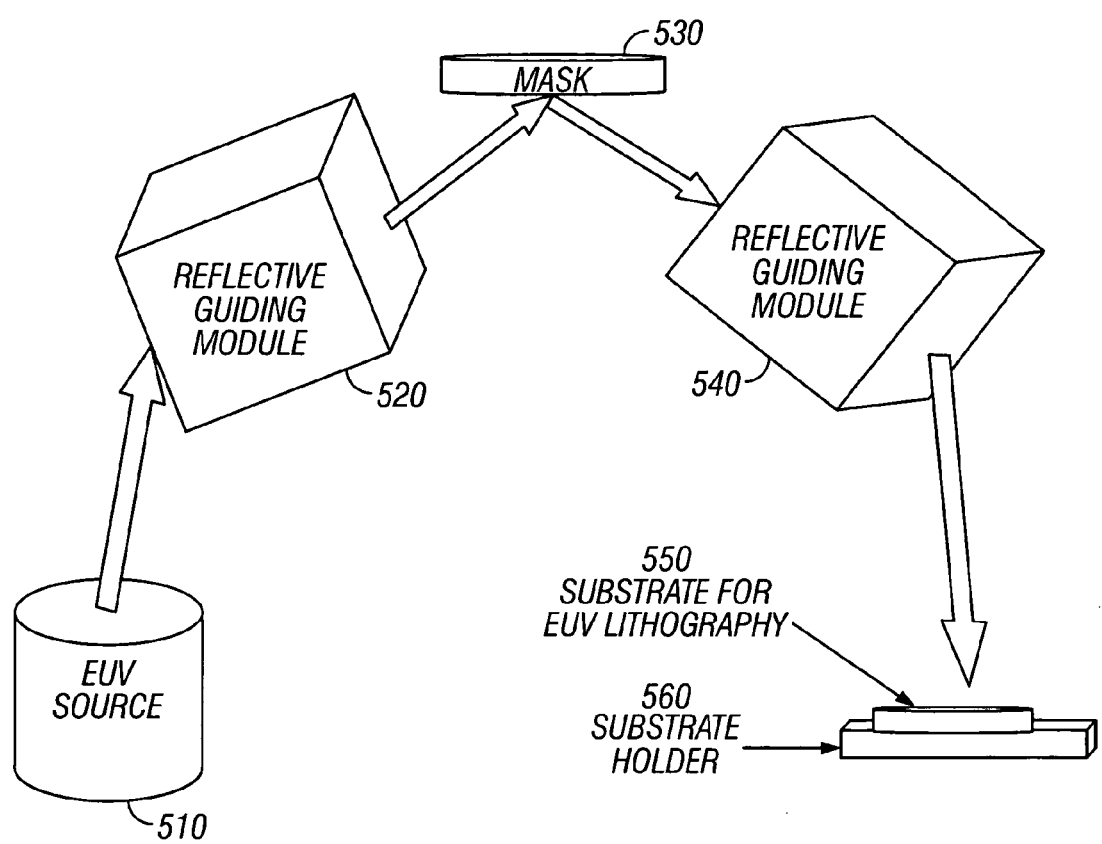
FIG. 5 shows an exemplary EUV system.

FIG. 5 shows an exemplary EUV system using the EUV reflective mask 530 described above. EUV radiation can be generated with an EUV source 510. In one implementation, the EUV source 510 may include a material that produces broad band radiation, including EUV radiation, in response to a laser pump beam. The EUV radiation can be guided through a first reflective guiding module 520 onto the EUV mask 530. The first reflective guiding module 520 may include condenser optics to help guide the EUV radiation to the EUV mask 530. The EUV mask 530 may be a patterned EUV mask 530 as shown in FIG. 4. Reflected EUV radiation from the EUV mask 530 may be transferred through a second reflective guiding module 540 to project an IC pattern onto a substrate 550. Both the first and second guiding modules 520, 540 may have multiple reflective surfaces to guide EUV radiation.

In a similar system implementation, a system comprises an extreme ultraviolet (EUV) source (e.g., 510) to produce extreme ultraviolet radiation, and a first reflective guiding module (e.g., 520) to receive and direct the extreme ultraviolet radiation. The system also includes an extreme ultraviolet mask (e.g., 530) to reflect the extreme ultraviolet radiation from the first reflective guiding module (e.g., 520) and produce reflected radiation having a spatial pattern to a second reflective guiding module (e.g., 540). The system further includes a substrate platform (e.g., 560) to position and hold a substrate for exposure to the reflected radiation from the second reflective guiding module (e.g., 540). The extreme ultraviolet mask (e.g., 530) may comprise a first multilayer of thin films (e.g., 114 in FIG. 2) to smooth surface defects on a extreme ultraviolet mask substrate, and a second multilayer of thin films (e.g., 116 in FIG. 2) comprising a reflective multilayer for extreme ultraviolet radiation. The second multilayer of thin films may be on top of the first multilayer of thin films, and the second multilayer of thin films may be deposited with atomic layer deposition (e.g., 116 in FIG. 2).

A number of implementations of the current disclosure have been described. Nevertheless, it will be understood that various modifications may be made without departing from the spirit and scope of the current disclosure. For example, an EUV mask with a first smoothing multilayer 114 and a second reflective multilayer 116 with fewer defects may be developed or processed differently from the processing described and shown in relation to FIGS. 3-4. In another example, the types of reflective multilayers may include different types of multilayers than the multilayers described above. For instance, either of the multilayers 114, 116 may include other alternating layers of EUV-type materials. Accordingly, other implementations are within the scope of the following claims.

What is claimed is:

1. An apparatus, the apparatus comprising:
   a substrate;

a first multilayer of films on top of the substrate to form a flat top surface by a first deposition process; and a second multilayer of films on top of and in contact with the first multilayer of films, the second multilayer of films effectuating a Bragg reflector to reflect extreme ultraviolet radiation, the second multilayer of films being deposited with a second deposition process different from the first deposition process, wherein the second deposition process comprises an atomic layer deposition process.

2. The apparatus of claim 1, wherein the first and second multilayers of films comprise alternating layers of films, wherein the alternating layers of films comprise a first film and a second film with different optical properties.

3. The apparatus of claim 2, wherein the first and second multilayers comprise one of Molybdenum and Silicon films, Molybdenum and Beryllium films, and Molybdenum and Silicon compound films, wherein the Silicon compound comprises one of Silicon Nitride and Silicon Dioxide.

4. The apparatus of claim 2, wherein the substrate comprises a low thermal expansion substrate.

5. The apparatus of claim 2, wherein the first deposition process is an ion beam deposition process.

6. The apparatus of claim 1, wherein the first multilayer of films planarizes and smoothes surface defects of 50 nm or less on the substrate.

7. The apparatus of claim 6, wherein the first multilayer of films comprises a range of 20 to 40 alternating layers of films.

8. The apparatus of claim 2, wherein the second multilayer of films comprises a range of 40 to 60 alternating layers of films.

9. The apparatus of claim 1, wherein the apparatus is an extreme ultraviolet mask blank.

10. The apparatus of claim 9, wherein the extreme ultraviolet mask blank is processed to form an extreme ultraviolet mask.

11. An apparatus, the apparatus comprising:

a low thermal expansion substrate;

a first multilayer of thin films on top of the low thermal expansion substrate, the first multilayer of thin films being deposited with ion beam deposition; and a second multilayer of thin films on top of and in contact with the first multilayer of thin films, the second multilayer of thin films comprising a multilayer reflective to extreme ultraviolet radiation, the second multilayer of thin films being deposited with atomic layer deposition.

12. The apparatus of claim 11, wherein the first multilayer of thin films comprises 20 to 40 alternating layers of thin films and the second multilayer of thin films comprises 40 to 60 alternating layers of thin films, wherein the alternating layers of thin films comprise one of Molybdenum and Silicon thin films, Molybdenum and Beryllium thin films, and Molybdenum and Silicon compound thin films, wherein the Silicon compound comprises one of Silicon Nitride and Silicon Dioxide.

13. The apparatus of claim 12, wherein the apparatus further comprises:

a patterned buffer layer on top of the second multilayer of thin films, the patterned buffer layer comprising an oxide layer; and a patterned absorber layer on top of the patterned buffer layer, the patterned absorber layer comprising a metal.

* * * * *